United States Patent [19]

Barbier et al.

[11] 4,048,574

[45] Sept. 13, 1977

[54] METHOD AND A DEVICE FOR ELIMINATING THE RESIDUAL ERROR VOLTAGE OF AN AMPLIFIER

[75] Inventors: Daniel Barbier, Echirolles; Jean-Michel Ittel, Seyssinet Pariset; Robert Poujois, Grenoble, all of France

[73] Assignee: Commissariat a l'Energie Atomique, Paris, France

[21] Appl. No.: 699,975

[22] Filed: June 25, 1976

[30] Foreign Application Priority Data

Sept. 1, 1975 France .................................. 75.20599

[51] Int. Cl.² .............................................. H03F 1/02
[52] U.S. Cl. ..................................... 330/9; 330/30 D; 330/35; 330/51; 330/69
[58] Field of Search ................. 328/127; 330/9, 30 D, 330/51, 69, 35

[56] References Cited

U.S. PATENT DOCUMENTS

| 3,737,793 | 6/1973 | Buch et al. ..................... 330/30 D X |
| 3,988,689 | 10/1976 | Ochi et al. ............................... 330/9 |

Primary Examiner—Lawrence J. Dahl

[57] ABSTRACT

The connections between the two inputs of an amplifier and the two outputs of a signal source as well as between the outputs of the amplifier and the inputs of a downstream output element into which the amplifier delivers a signal are inverted periodically and simultaneously and integration is carried out between the outputs of the amplifier and the inputs of the output element. In addition, the inputs of the amplifier are short-circuited periodically, the frequencies of inversion and of short-circuiting being multiples of each other.

11 Claims, 13 Drawing Figures

METHOD AND A DEVICE FOR ELIMINATING THE RESIDUAL ERROR VOLTAGE OF AN AMPLIFIER

This invention relates to a method of elimination of the residual error voltage of an amplifier. The invention also relates to a device for carrying out said method.

The residual error voltage (sometimes known as the false-zero input voltage) is the equivalent voltage which when applied to the input of an amplifier, produces at the output a voltage equal to the parasitic voltage observed when there is no real signal at the input of the amplifier. In the case of the ideal amplifier, the error residual voltage is zero.

In order to obtain a zero potential at the output of the amplifier, it is necessary to apply to the input of this latter an equal voltage of opposite direction which reduces said parasitic voltage to zero or to apply at the output a voltage equivalent to the false-zero input voltage which is amplified by said amplifier.

The errors introduced by the residual error voltage are the cause of a large number of disadvantages in the high-gain amplifiers employed in particular for amplifying low voltages (output voltage of thermocouple devices, for example).

Different known methods exist for automatic zeroresettting of the error voltage of an amplifier or of an amplifying chain comprising a number of amplifiers. Some methods consist in placing a capacitor at the input or at the output of the amplifier or amplifiers and in charging said capacitor prior to introduction of a signal with a view to ensuring that a voltage which is equal but of opposite sign to the residual error voltage is developed between the plates of said capacitor. Then, when the capacitor is isolated at the input or at the output of the amplifier, the voltage developed at its terminals acts in opposition to the residual error voltage and the signal is suitably amplified without error. As will hereinafter become apparent, this method is also employed in an amplifying chain constituted by amplifiers in series.

However, when said capacitors are placed at the input of the amplifier, one disadvantage of the method arises from the act that the preliminary storage of the error voltage is particularly sensitive to all parasitic phenomena; on the other hand, when the capacitor is placed at the output, it is essential to ensure that the residual error voltage does not saturate the amplifier on open circuit (this condition being difficult to satisfy in the case of high-gain amplifiers).

Another method for eliminating the error voltage consists in making use of a so-called "chopper." In this type of device, the inputs and the outputs of the amplifier are "chopped" at the same frequency by an input chopper and an output chopper which are strictly synchronous. Thus the amplifier amplifies an alternating-current voltage but does not have to transmit the low frequencies, thus making it possible to eliminate drift (and the practically continuous residual input voltage) which comprises only very low frequencies.

One of the objects of the present invention is to provide a method for limiting the disadvantages and shortcomings of the methods of the prior art, especially in regard to switching noise developed in capacitors and drift as a function of time of the residual error voltage which remains.

In fact, in accordance with the method of the present invention the inputs and outputs of an amplifier are "chopped" at the same frequency $f$ as in the prior art in order to invert the two inputs and the two outputs of the amplifier. In addition, there is placed at the output of the amplifier an integrator which has the property of establishing the mean value of the signals at the frequency $f$ while permitting signals at a lower frequency to pass without modification. This integrating device is advantageously provided by an integrator of the resistance-capacitance type, the constant of which is such that $RCf > 1$.

This convenient method operates satisfactorily only if the error signal introduced by the amplifier does not saturate said amplifier. Should this be the case, the method of chopping of the signal at the input and at the output of the amplifier (inversion of the inputs and of the outputs) can advantageously be combined in a suitable manner in accordance with the invention as will be explained below with periodic short-circuiting of the amplifier input.

This periodic short-circuiting prevents the error signal introduced by the amplifier from saturating this latter since short-circuiting brings back to zero the value of the signal introduced by the amplifier each time a short-circuit is re-established.

Finally, in a preferential embodiment of the invention, the method of chopping of the signal at the input and at the output of the amplifier (or of the amplifying chain) as completed by integration at the output is suitably combined with periodic short-circuiting of the amplifier input which makes it possible in addition to store the error voltage in capacitors, these two operations being performed in synchronism at suitable time intervals which will be defined hereinafter.

In more exact terms, the preferential method of execution of the invention consists in periodically and simultaneously inverting the connections between the two inputs of said amplifier (or of the amplifying chain) which the outputs of a source of signals to be amplified and the outputs of said amplifier with the inputs of the downstream output element, in periodically short-circuiting the inputs of said amplifier in synchronism with the operations of inversion of the inputs and of the outputs of said amplifier, the frequencies of inversion and of short-circuiting being multiples of each other, and in addition in carrying out an integration between the outputs of said amplifier and the inputs of the output element.

Depending on the applications, the connections between the inputs of the amplifier and the outputs of the voltage source will be inverted simultaneously with the inversions of the output terminals of the amplifier with the inputs of the downstream element whereas the inputs of said amplifier are short-circuited or alternatively outside the periods in which the inputs of said amplifier are short-circuited.

The amplifier employed in the practical application of the invention can be constituted by a single amplifier or by an amplifying chain. In the event that the amplifier is constituted by a chain of amplifying units, each amplifying unit is provided with capacitors in the preferential method of execution of the invention. In this alternative embodiment, said method consists in short-circuiting the inputs of each amplifying unit whereas, in synchronism, the connection of the inputs of the first amplifier and the connection of the output of the last amplifiers are inverted with respectively the source associated with the first amplifying stage and the downstream element of the last amplifying stage.

In the device for carrying out the invention, MOS transistors will advantageously be employed for carrying out the various operations of interconnection and short-circuiting, said transistors being intended to operate on the all-or-none principle or in other words to interrupt the circuit or conduct the signals.

Further properties and advantages of the invention will become more readily apparent from the following description of exemplified embodiments which are given by way of explanation without any limitation being implied, reference being made to the accompanying drawings, wherein:

Figure 1:
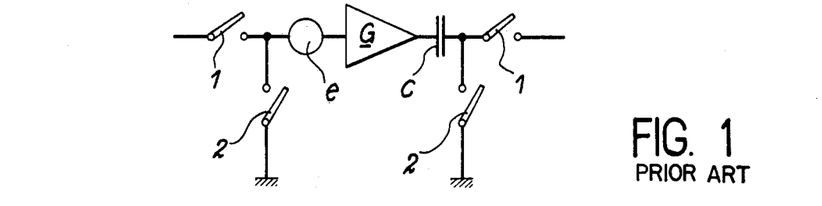
FIGS. 1, 2 and 3 show devices of the prior art for eliminating the residual error voltage of an amplifier or of an amplifying chain.

FIG. 1 illustrates a known form of construction employed in the prior art for eliminating the residual error voltage. In this device, an amplifier G is placed between two series of switches 1 and 2, the switches designated by the same numeral being intended to operate simultaneously. The source of residual equivalent-error voltage related to the input is designated by the reference $e$. The capacitor C is placed at the output of the amplifier G. The method adopted for storing the residual error voltage $e$ in the capacitor C comprises two steps: in a first step, the switches designated by the reference 1 are open and the switches 2 are closed; since the gain of the amplifier G is also designated as G, the capacitor C is charged at the instant $t_0$ to a voltage $Ge(t_0)$. The second step consists in opening the switches 2 then in closing the switches 1, with the result that the signal derived from the source (not shown) placed upstream of the left-hand switch 1 is applied to the input of the amplifier. The error voltage at the instant $t$ is equal to:

$$V = Ge(t) - Ge(t_0) \simeq 0 \text{ if } t \simeq t_0$$

Figure 2:
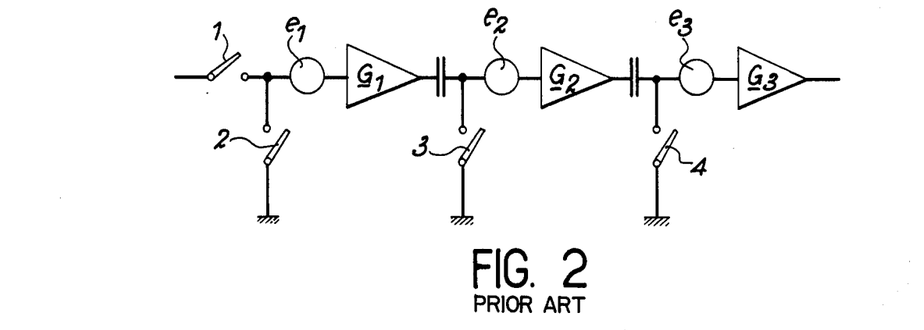

The device shown in FIG. 1 has a disadvantage in that G must be of low value since the amplifier is on open circuit and must not be saturated by the amplified input voltage $Ge(t_0)$. Moreover, the storage is not perfect by reason of the noise generated by the closing and opening of the switches 1 and 2. There is shown in FIG. 2 an amplifying chain comprising three amplifiers having the respective gains $G_1$ and $G_2$ and 1 and the residual intrinsic-error voltage $e_1$, $e_2$ and $e_3$. At the instant $t_0$, the switch 1 is opened and the switches 2, 3 and 4 are closed; the capacitors $C_1$ and $C_2$ are charged respectively by the voltages $G_1e_1$ and $G_2e_2$. In a second stage, the switch 3 is opened. The voltage at the terminals of the capacitors $C_1$ is modified by the value $\epsilon_1$ by the noise produced by the operation of the switch 3. This noise modifies the charge of the capacitor $C_2$ which changes from $G_2e_2$ to $G_2(e_2 + \epsilon_1)$, thus cancelling the effect of $\epsilon_1$.

In the third stage, the switch 4 is opened and produces a noise $\epsilon_2$; at this instant, the system has a value of residual error voltage related to the input which is equivalent to $(e_3 + \epsilon_2)/G_1G_2$, and the last amplifier has a gain of 1. When it is desired to connect a source to the input, the switch 2 is opened and the switch 1 is closed. The only limitation imposed in this method is the number of stages which introduce background noise since this latter is considerably amplified by said number of stages.

Figure 3:
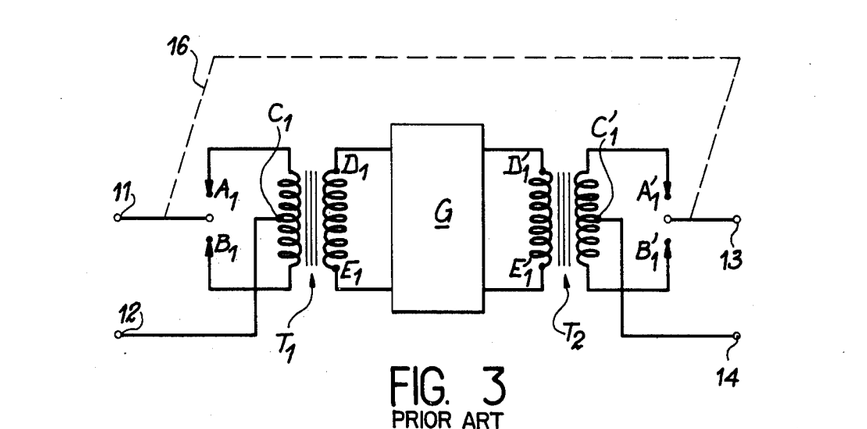

The principle of the chopping amplifier which makes use of double modulation and demodulation is recalled in connection with FIG. 3. In this chopping amplifier, the signal transmitted arrives between the terminals 11 and 12 and passes out between the terminals 13 and 14. The chopper which carries out the chopping operation is represented diagrammatically by a vibrating strip which connects the terminal 11 alternately to the points $A_1$ and $B_1$ and likewise at the output connects the terminal 13 to the points $A_1'$ and $B_1'$. The transformers $T_1$ and $T_2$ are identical and the two choppers are strictly synchronous. This synchronization is represented schematically by the mechanical connection shown as a broken line 16. The operation of the device shown in FIG. 3 is explained with reference to the diagrams of FIG. 4.

Figure 4:
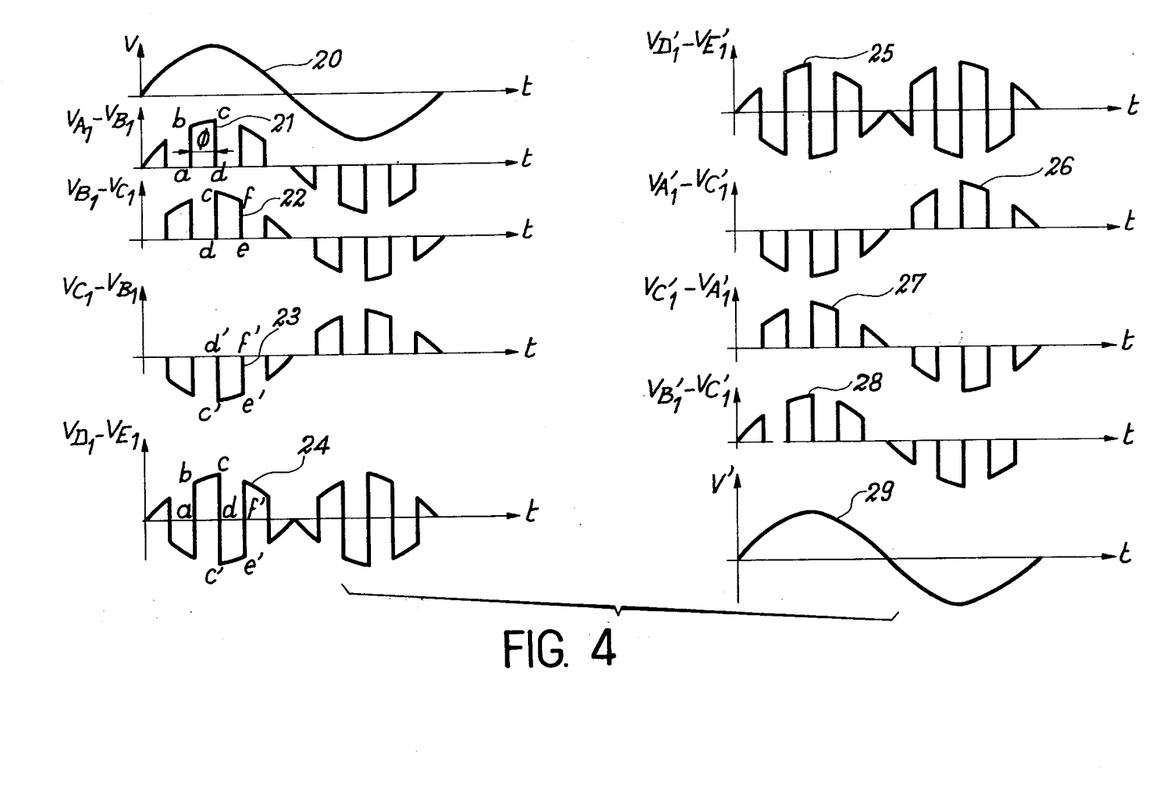
FIG. 4 shows the curves which explain the operation of the device of FIG. 3.

Curve 20 of the potential V as a function of the time $t$ represents the variations of a low-frequency signal applied between the terminals 11 and 12 of the device of FIG. 3. When the contact is established at $A_1$ during a certain time interval $\phi$ the signal which passes through the upper half of the primary winding of the transformer $T_1$ has the shape $a$, $b$, $c$, $d$, as represented on curve 21. After one half-period of vibration of the chopper (for example 1/800 of a second if the chopper vibrates at 400 c/s), the strip establishes a contact between $B_1$ and the lower half-winding of the primary of the transformer $C_1$, thus producing between $B_1$ and $C_1$ the signal $d$, $c$, $e$, $f$ as represented on curve 22; by reason of the fact that the flux is reversed since the point $C_1$ is located at the center of the primary of the transformer, the transformer $T_1$ receives a signal of opposite polarity with respect to the signal 22 or in other words the signal 23, that is, the signal $d'$, $c'$, $e'$, $f'$ during one half-period. In consequence, the secondary of the transformer T will deliver a signal $a$, $b$, $c$, $d$, $c'$,$e'$,$f'$ during a full period and the signal applied to the input of an amplifier G will have the shape represented on curve 24, namely the potential $V_{D1} - V_{E1}$. It is apparent that this signal is an alternating-current signal since its polarity is alternately negative and positive and the change of polarity takes place at the frequency of the chopper.

It can be noted that, when the input signal passes through zero, the phase of the "chopped" signal is reversed. This makes it possible to restitute the signal at the output of the chopper amplifier G together with its sign.

In fact, there is placed at the output of the amplifier G a transformer $T_2$ which is similar to the input transformer $T_1$; the secondary of $T_2$ is composed of a winding having a mid-point $C_1'$ and a chopper which is strictly synchronous with the input chopper connects the output 13 alternately to either of the two half-windings. The voltage signals which appear between the terminals $A_1'$, $B_1'$, $E_1'$, $D_1'$ and $C_1'$ are represented on curves 25, 26, 27 and 28. Again by reason of the midpoint $C_1'$, a reversal of polarity takes place at the output of each half-period and the signal $V'$ (curve 29) is present at the output between the terminals 13 and 14, with $V' = GV$, $G$ being the gain of the amplifier.

It is therefore apparent that the amplifier G has the intended function of amplifying an alternating-current voltage having a frequency which is close to that of the chopper and does not have to transmit low frequencies; by making use of circuits which have a differentiating function, it is possible to limit the pass-band on the low-frequency side and therefore to eliminate the drift which comprises only very low frequencies.

Figure 5A:
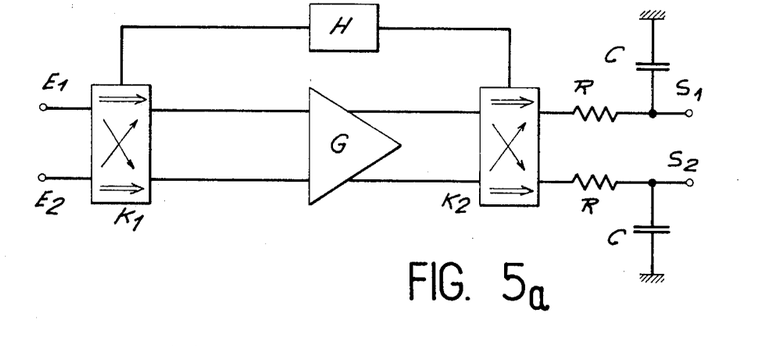
FIG. 5a is a diagram of one embodiment of the invention.

In FIG. 5a, there is shown one embodiment of the device for the application of the method according to the invention. The signal to be amplified is passed between the inputs $E_1$ and $E_2$ and the device is provided as in the diagram shown in FIG. 3 with a "chopper" switch $K_1$ and a switch $K_2$ for interchanging the connections of the inputs of the amplifier G with the inputs $E_1$ and $E_2$ connected to the supply as well as the outputs of the amplifier G with the outputs $S_1$ and $S_2$.

In the prior art, the amplifier G was frequency-tuned to the switching frequency $f$, with the result that the error or drift signals were not transmitted by this amplifier. In the device according to the invention, there is no longer any reason to maintain this limitation in regard to the passband of the amplifier G. In fact, as can be seen from FIG. 6a, the drift voltages generated by the amplifier are chopped by the switch $K_2$ at the frequency $f$ and are eliminated by a high-pass filter connected in shunt and constituted in this case by resistor-capacitor pairs of conventional type. Thus the output drift voltages are modulated and then the mean values of these latter are determined by the RC integrator. On the other hand, the signal emitted by the source connected to the inputs $E_1$ and $E_2$ at lower frequency is not integrated and is again present at the outputs $S_1$ and $S_2$. Synchronous control of the switches $K_1$ and $K_2$ can be carried out by the clock H; this switching control can be performed as in the device of the prior art shown in FIG. 3 or by any other means.

As mentioned earlier, the device in accordance with the invention and illustrated in FIG. 5a operates satisfactorily only if the error or drift voltages generated by the amplifier do not saturate this latter. In fact, in order to prevent this saturation, the offset voltage of the amplifiers related to the input must be very low, namely of the order of 1 $\mu V$. This type of performance can be obtained in certain types of amplifiers, especially bipolar transistors, or by making use of other known means for reducing the error voltage, such as, for example, a bias bridge of conventional type.

Figure 5B:
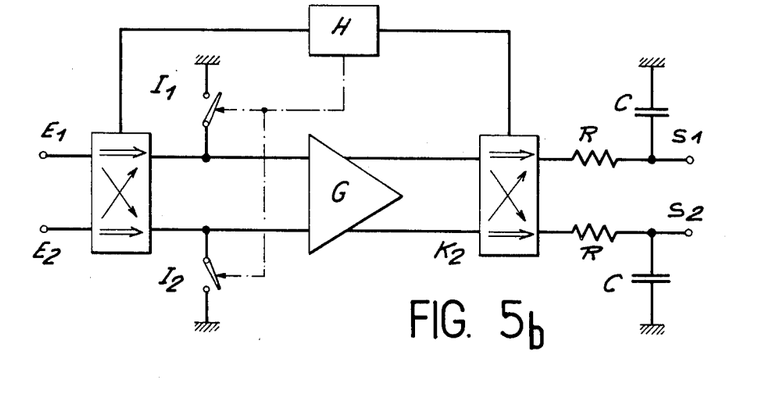
FIG. 5b is a diagram of an alternative embodiment of the invention.

There is shown in FIG. 5b an alternative embodiment of the invention in which the same elements as those illustrated in FIG. 5a are designated by the same reference numerals. There are shown in addition two short-circuit switches I and $I_e$ for short-circuiting the inputs of the amplifier G at a frequency which is preferentially equal to the frequency $f$ (controlled by the clock H) or at a frequency which is either a multiple or submultiple of said frequency $f$. This short-circuiting operation must in any case take place in synchronism with the switching operations of the switches $K_1$ and $K_2$. As will be seen in connection with FIG. 5c, switching must not be carried out between two zero-resets by the switches $I_1$ and $I_2$. This alternative embodiment makes it possible to overcome the limitations arising from possible saturation of the amplifier G since the error voltage is reset to zero at each short-circuit and therefore cannot attain amplitudes of the same high order as the device of FIG. 5b.

Figure 5C:
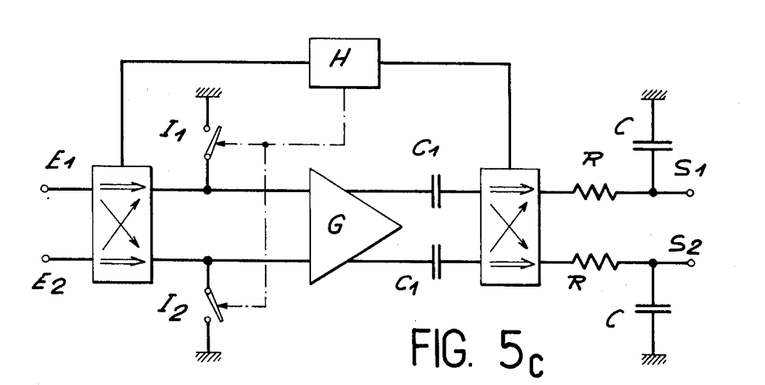
FIG. 5c is a diagram of a preferential alternative embodiment of the invention.

In FIG. 5c, there is shown a preferential alternative embodiment of the invention in which the same elements as those illustrated in FIG. 5b are designated by the same references. There are shown in addition two capacitors $C_1$ placed after the amplifier G which are elements for storing the residual error voltage and provide a further improvement to the device in order to produce better results. These capacitors perform the same function as the capacitor C of FIG. 1. A more detailed description of a device of the type shown in FIG. 5c is given in FIG. 7.

In order to obtain an error signal as a function of time at a zero mean value, the devices shown in FIGS. 2 and 3 are combined in accordance with this preferential embodiment of the invention by adapting their respective frequency and adding an integrating stage at the output while avoiding any limitation of the pass-band of the amplifier G on the low-frequency side. The method according to this embodiment of the invention associates storage of the error voltage with the conventional method of periodic transposition of the inputs and outputs.

Figure 6A:
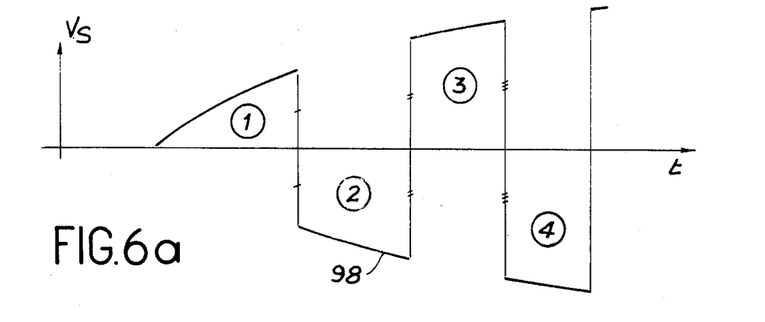
FIGS. 6a, 6b, 6c and 6d are explanatory diagrams of the method in accordance with the invention.

In FIG. 6a, there are shown as a function of time the variations in the error voltage $V_S$ which appear at the output of the switch $K_2$ of FIG. 5a prior to establishment of the mean value by the RC pair. It is apparent that, "in mean value," the signal represented at 98 is approximately zero (the algebraic mean of the areas 1, 2, 3, 4, . . .). this mean value being established on a time scale of the order of $1/f$. In all the devices shown later, the switching and short-circuiting frequencies adopted will be equal to $f$.

Figure 6B:
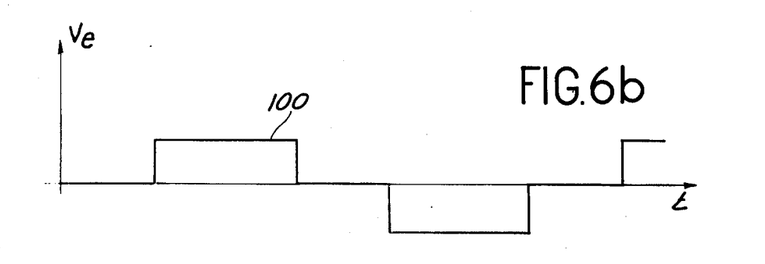
Figure 6C:
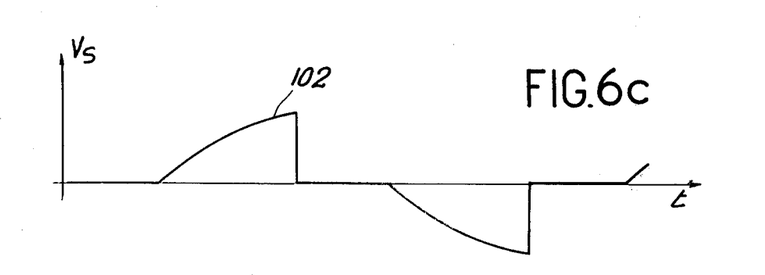
Figure 6D:
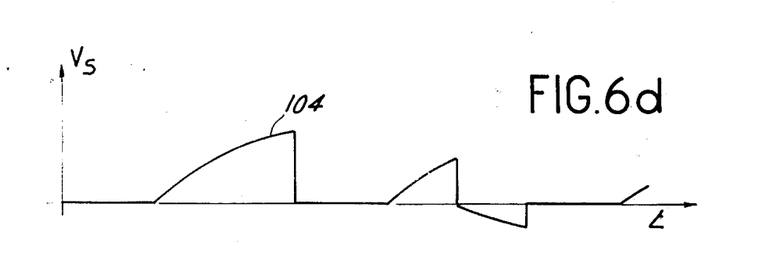

In FIG. 6b, there is shown on curve 100 as a function of time the cycle of signals applied to the input of each amplifier of devices such as those shown in FIGS. 5b and 5c in which the zero-reset times R.Z. (return to zero) correspond to the input short-circuit of the amplifier G. On curve 102 of FIG. 6c, there are shown as a function of time the variations in error voltage at the output of the amplifier. The error signal is at zero mean value. By integrating by means of a RC output circuit for example, a zero error voltage is obtained at the output. This is applicable, however, only if the error voltage is stored during the zero-reset period. In FIG. 5d, the signal shown is the signal obtained if there is faulty synchronization of the operations of short-circuit-storage and of inversion of the inputs and outputs of the amplifier or amplifiers.

Figure 7:
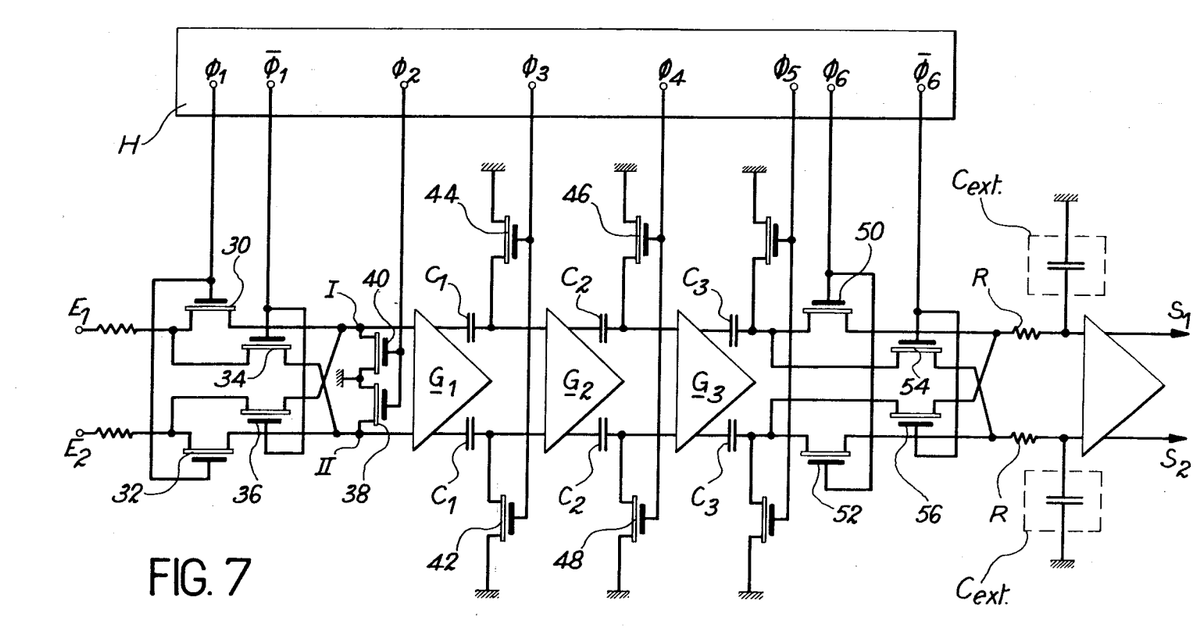
FIG. 7 is a form of construction of an amplifying chain for eliminating the residual error voltage in accordance with the invention.

The preferential device in accordance with the invention as shown by way of example in FIG. 7 comprises three main amplifiers $G_1$, $G_2$ and $G_3$. The voltage source is connected between the inputs $E_1$ and $E_2$ of the amplifier $G_1$; inversion of the inputs $E_1$ and $E_2$ is carried out by means of the transistors 30, 32, 34, 36 and short-circuiting of the input of the amplifier G for example is carried out by the means of the transistors 38 and 40. Similarly, short-circuiting of the input of the amplifier $G_2$ is carried out by means of the transistors 42 and 44, short-circuiting of the input of the amplifier $G_3$ is carried out by means of the transistors 46 and 48. There is added an inversion device for demodulation at the output which is constituted by the transistors 50 and 52, 54 and 56. The gates of the transistors which are preferably field-effect MOS transistors are driven by the voltages corresponding to the diagram of phases delivered by the clock H such as those shown in FIG. 8 with time scales given by way of example. The device R, $C_{ext}$ at the output makes it possible to integrate the variations in residual error voltage and to deliver between the outputs $S_1$ and $S_2$, after amplification, a signal in which no residual error voltage is present.

It can further be noted that this device also makes it possible to stabilize the negative feedback amplifier against possible oscillations and limits the pass-band at high frequencies.

When a potential determined by the characteristics of the transistors is applied to the gates of the transistors 38 and 40, the input terminals I and II are short-circuited. When the transistors 30 and 32 are in the conducting state (the transistors 34 and 36 being in the non-conducting state), the potential at $E_1$ is applied to the terminal I and the potential at $E_2$ is applied to the terminal II. Similarly, when the transistors 34 and 36 are in the conducting state and the transistors 30 and 32 are in the non-conducting state, the potential at $E_1$ is applied to the terminal II and the potential at $E_2$ is applied to the terminal $E_1$. The synchronization is such that, during a time interval which is determined beforehand, the transistors 30, 32, 50 and 52 are conductive whilst the transistors 34, 36, 54 and 56 are cut-off and then, during a separate time interval, the transistors 34, 36, 54 and 56 are caused to conduct whilst the transistors 30, 32, 50 and 52 are caused to cut-off.

The novel method of compensation in accordance with the invention has the advantage of achieving the practically complete elimination of the residual error voltage of an amplifier provided with a periodic zero-reset system by means of the transistors for short-circuiting the input of each amplifier such as the transistors 38 and 40, thus making it possible to store the residual error voltage in the capacitors such as those designated by the references $C_1$ and $C_2$ or $C_3$ (see FIGS. 1 and 2 of the prior art and the comments made with reference to these latter).

The error signal which remains after operation of this system is suppressed by means of a periodic change of sign (demodulation) and an integration which are carried out at the output of the amplifier. In order to restore the shape of the input signal, it is found necessary at the same time to carry out a synchronous modulation at the input as in the known method but for a different purpose.

It is worthy of note that, if the synchronous modulation-demodulation (obtained in this case by inverting the input and output connections and integration at the output) is simply associated with a device for periodic zero-resetting, complete nullification of the error voltage is not thereby achieved.

The mean value (obtained by integration) of the error voltage is zero only if the modulation-demodulation frequency is synchronous or in other words a multiple, equal, or a submultiple, of the zero-reset frequency. It is an advantage to take the precaution of restoring the amplifier to equilibrium prior to each transposition of the inputs and outputs.

Figure 8:
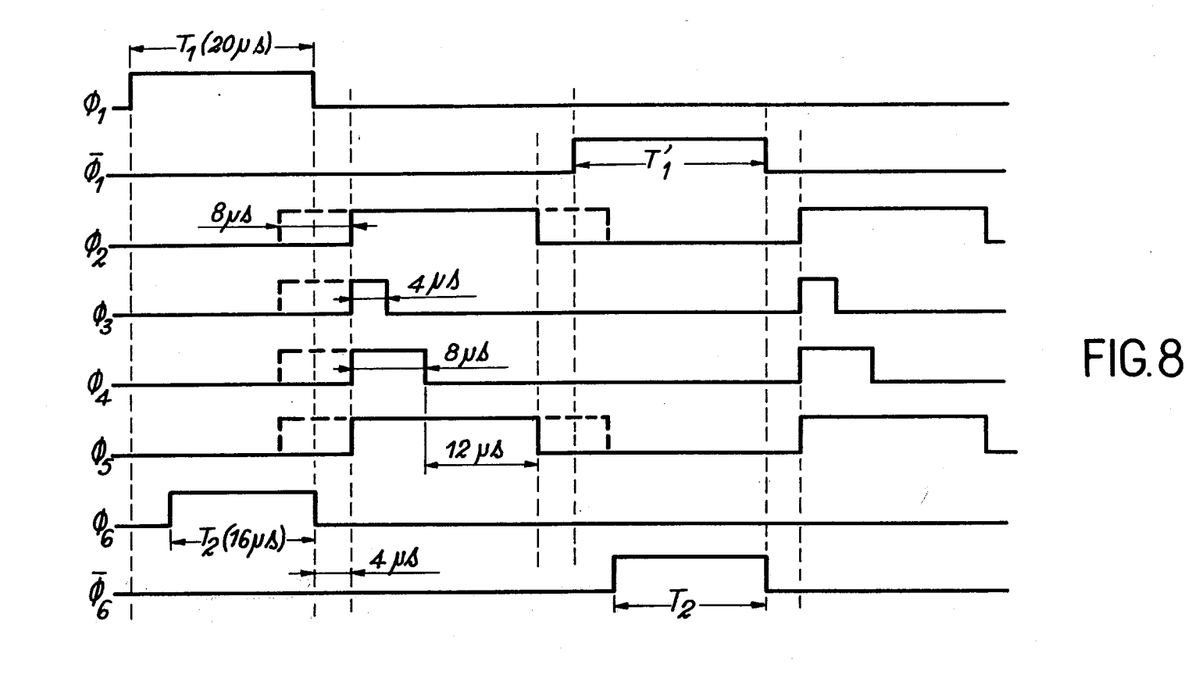
FIG. 8 is a diagram of synchronization of clock signals which control the amplifying chain shown in FIG. 7.

The operation of the device shown in FIG. 7 can be more readily understood by means of the synchronization diagram of FIG. 8: the clock H delivers the signal $\phi_1$ which is applied to the gates of the transistors 30 and 32, thus triggering these transistors into conduction during the time interval $T_1$ having a value of 20 $\mu s$, for example, and the signal passes during this time interval $T_1$ (which corresponds to the period a, b, c, d, for example of FIG. 4). Then in the order of increasing values of time, the input of the amplifier $G_1$ is short-circuited to ground by the signal $\phi_2$ shown in a full line. During this time interval, the capacitors $C_1$ are charged by the input residual voltage which is amplified by the gain $G_1$. Thereupon, the signal $\phi_1$ drives the gates of the transistors 34 and 36 which conduct during the time interval $T_1'$ as shown in FIG. 8.

In this example, it can be understood that, between each inversion of the input and output connections of the amplifying chain, the inputs of the amplifiers $G_1$, $G_2$, $G_3$ are connected to ground by means of the voltages $\phi_2$, $\phi_3$ and $\phi_4$. As explained with reference to FIG. 2, the short-circuiting of the amplifiers $G_1$, $G_2$, $G_3$ corresponding to the switches 2, 3 and 4 of FIG. 2 are closed in sequence in the case of FIG. 8 during the time intervals of 4 $\mu s$, 8 $\mu s$ and 12 $\mu s$, for example. This makes it possible to store in the last capacitor $C_3$ the switching voltages developed by closure of the preceding input circuits. Demodulation of the signal is carried out by means of the voltages $\phi_6$ and $\overline{\phi}_6$. The signal $\phi_6$ preferentially has a time-duration $T_2$ which is slightly shorter than $T_1$. In this example of operation corresponding to the full lines in $\phi_2$, $\phi_3$, $\phi_4$ and $\phi_5$, transposition of the inputs and outputs is carried out outside the time interval in which the inputs of the amplifiers are connected to ground.

In another embodiment of the invention, it is possible to carry out this transposition whilst the inputs of the amplifiers $G_1$, $G_2$ and $G_3$ are connected to ground by making use of the signals $\phi_2$ and $\phi_3$, $\phi_4$ and $\phi_5$ such as those shown in dashed lines.

If the inversion of the inputs and outputs is carried out during connection of the inputs to ground, the voltage source connected between the terminals $E_1$ and $E_2$ is short-circuited. In order to overcome this disadvantage (when this does in fact constitute a disadvantage), the phase-diagram of the clock is established as shown in full lines in FIG. 8. However, the phase diagram as represented on the dashed lines of the signals $\phi_2$, $\phi_3$, $\phi_4$ and $\phi_5$ in which inversion of the inputs and outputs is carried out at the time of connection of said inputs to ground nullifies switching noise introduced by the inversion of the inputs. Depending on the applications which are contemplated, either of these two types of synchronization may be employed, that is to say clock signals delivered by the clock H and having different synchronization. The electronic device employed for generating the signals $\phi_1$ to $\phi_6$ is not explained in detail since this is conventional and well known to any one versed in the art. The frequency of periodic inversions of the input and output connections is a multiple, a submultiple or is equal (as in the case shown in FIG. 8) to the zero-reset frequency of the inputs of the amplifiers. By making use of a device as shown in FIG. 6, it has been possible to obtain maximum residual error voltages of 5 $\mu V$ and drifts of the order of 0.05 $\mu V/°$ C.

This represents an appreciable improvement over the best amplifiers which are commercially available and at present have a drift of the order of 0.2 $\mu V/°$ C and a residual error voltage of the order of 50 $\mu V$.

What we claim is:

1. A method of elimination of the residual error voltage of an amplifier having two inputs supplied from a signal source and two outputs, said amplifier being intended to deliver a signal into an output element downstream of said amplifier, wherein the connections between the inputs of said amplifier are periodically inverted with said source and the outputs of said amplifier are inverted with said output element and wherein an integration is carried out between the outputs of said amplifier and the inputs of the output element.

2. A method according to claim 1, wherein said method further consists in periodically short-circuiting the inputs of said amplifier, the frequencies of the inversion and short-circuiting operations being multiples of each other.

3. A method of elimination of the residual error voltage of an amplifier having two inputs supplied from a signal source and two outputs provided with a storage element, said amplifier being intended to deliveer a signal into a downstream output element of said amplifier, wherein said method consists in periodically and simultaneously inverting the connections between the inputs of said amplifier with said source and in inverting the outputs of said amplifier with said output element, wherein the inputs of said amplifier are short-circuited periodically, the frequencies of the inversion and short-circuiting operations being multiples of each other and wherein an integration is carried out between the outputs of said amplifier and the inputs of the output element.

4. A method according to claim 3, wherein the inversion operation is carried out in a number of steps: initially the two input terminals A and B of the amplifier are connected respectively to the two output terminals C and D of the source and similarly the two outputs A' and B' of the amplifier are connected respectively to the inputs C' and D' of the element located downstream of said amplifier, whereupon the connections between the terminals A, B, C, D, A', B', C', D' are disconnected, the inputs of said amplifier are then short-circuited and after disconnecting the input short-circuit of the amplifier, the terminals of said amplifier and of the downstream element are connected by reversing them with respect to the preceding arrangement or by connecting A and D and B and C and similarly A' and D', B' and C', whereupon the operations of inversion and short-circuiting are repeated in the same order after a predetermined time interval.

5. A method according to claim 3, wherein the operation of inversion of the connections at the input and at the output of the amplifier is carried out during a time interval in which the inputs of said amplifier are short-circuited.

6. An amplifying device, wherein said device comprises:
at least one amplifier having two inputs A and B and two outputs A' and B', said amplifier being provided with a storage element,
means for inverting the connections of the inputs A and B of said amplifier with the outputs C and D of a signal source and for simultaneously inverting the connections of the outputs A' and B' of said amplifier with the inputs C' and D' of the downstream element of said amplifier,
means for short-circuiting the inputs of said amplifier during a predetermined period of time.

7. A device according to claim 6, wherein said storage element comprises at least one capacitor.

8. An amplifying device according to claim 6, wherein said devce comprises N amplifiers, each output of an amplifier being connected to the input of a following downstream amplifier by means of a capacitor, means for short-circuiting the input of each amplifier and means for inverting in synchronism the inputs of the first amplifier and the outputs of the last amplifier.

9. A device according to claim 6, wherein said device comprises means for inverting the connections of the inputs and of the outputs of the amplifier or amplifiers during the time interval in which the inputs of the amplifier or amplifiers are short-circuited.

10. A device according to claim 6, wherein said device comprises means for inverting the input connections of said amplifier or of said amplifiers when the input or inputs of said amplifiers are not short-circuited.

11. A device according to claim 6, wherein said device comprises field-effect transistors inserted in series in the inputs and outputs of said amplifiers, said transistors being capable of establishing on the one hand the connection of the amplifier or amplifiers to the signal source and to the downstream elements and on the other hand of short-circuiting the input of each amplifier, said transistors being driven by biasing signals applied to the transistor gates and a clock being intended to deliver the recurrent signals to said gates.

* * * * *